United States Patent
Almy et al.

(10) Patent No.: US 10,587,216 B2
(45) Date of Patent: Mar. 10, 2020

(54) OVER-CENTER UNDER PHOTOVOLTAIC MODULE CLAMP

(71) Applicant: SolarCity Corporation, San Mateo, CA (US)

(72) Inventors: Charles Bernardo Almy, Berkeley, CA (US); Kathryn Austin Pesce, San Francisco, CA (US)

(73) Assignee: SolarCity Corporation, San Mateo, CA (US)

( * ) Notice: Subject to any disclaimer, the term of this patent is extended or adjusted under 35 U.S.C. 154(b) by 427 days.

(21) Appl. No.: 15/134,307

(22) Filed: Apr. 20, 2016

(65) Prior Publication Data

US 2017/0310273 A1    Oct. 26, 2017

(51) Int. Cl.
*H02S 20/32* (2014.01)
*H02S 30/10* (2014.01)
*F24S 25/634* (2018.01)
*F24S 30/425* (2018.01)
*F24S 25/632* (2018.01)
*H01L 31/042* (2014.01)

(52) U.S. Cl.
CPC ............ *H02S 20/32* (2014.12); *F24S 25/632* (2018.05); *F24S 25/634* (2018.05); *F24S 30/425* (2018.05); *H01L 31/042* (2013.01); *H02S 30/10* (2014.12)

(58) Field of Classification Search
CPC .......... H02S 30/10; H02S 20/00; H02S 20/32; F24S 25/425; F24S 25/632; F24S 25/634; H01L 31/042
See application file for complete search history.

(56) References Cited

U.S. PATENT DOCUMENTS

| | | | |
|---|---|---|---|
| 4,498,822 A | 2/1985 | Diba | |
| 6,809,251 B2 | 10/2004 | Dinwoodie | |
| 7,647,924 B2 | 1/2010 | Hayden | |
| 7,832,157 B2 | 11/2010 | Cinnamon | |
| 8,109,393 B2 | 2/2012 | Haeberlein | |
| 8,371,076 B2 | 2/2013 | Jones et al. | |
| 8,567,134 B1 * | 10/2013 | Grushkowitz | H02S 20/32 52/173.3 |

(Continued)

FOREIGN PATENT DOCUMENTS

| | | |
|---|---|---|
| CN | 201000241 Y | 1/2008 |
| DE | 19601069 A1 | 4/1997 |

(Continued)

OTHER PUBLICATIONS

First Action Interview Pilot Program Pre-Interview Communication dated May 23, 2018 in U.S. Appl. No. 15/092,602, filed Apr. 6, 2016. 4 pages.

(Continued)

*Primary Examiner* — Mayla Gonzalez Ramos
(74) *Attorney, Agent, or Firm* — Dentons US LLP

(57) ABSTRACT

Photovoltaic modules are mounted onto PV module mounting brackets of a solar torque tube via clamps. The clamps include a first hook rotatably attached to a main body, and a second hook rotatably attached to the main body. The clamps provide for simultaneously securing a first photovoltaic module to the bracket with the first hook and securing a second photovoltaic module to the bracket with the second hook without the need for tools.

8 Claims, 13 Drawing Sheets

(56) References Cited

U.S. PATENT DOCUMENTS

| | | |
|---|---|---|
| 8,650,813 B2 | 2/2014 | Botkin et al. |
| 8,757,567 B2 | 6/2014 | Ciasulli et al. |
| 8,813,460 B2 | 8/2014 | Cinnamon et al. |
| 8,822,812 B2 | 9/2014 | Wares |
| 8,839,784 B2 | 9/2014 | Wares et al. |
| 8,881,415 B2 | 11/2014 | Barton |
| 8,887,920 B2 | 11/2014 | Pelman et al. |
| 9,172,325 B2 | 10/2015 | Klinga et al. |
| 9,184,324 B2 | 11/2015 | Wares et al. |
| 9,263,985 B2 | 2/2016 | Silberschatz et al. |
| 9,281,778 B2 | 3/2016 | Corio et al. |
| 2004/0140002 A1* | 7/2004 | Brown ............... F24S 25/632 136/251 |
| 2006/0005875 A1 | 1/2006 | Haberlein |
| 2006/0032527 A1 | 2/2006 | Stevens et al. |
| 2010/0089390 A1 | 4/2010 | Miros et al. |
| 2010/0313499 A1 | 12/2010 | Gangemi |
| 2011/0290307 A1 | 12/2011 | Workman et al. |
| 2012/0180845 A1 | 7/2012 | Cole et al. |
| 2012/0233940 A1 | 9/2012 | Perkins et al. |
| 2014/0246549 A1* | 9/2014 | West ............... H02S 20/30 248/220.22 |
| 2014/0261626 A1 | 9/2014 | Ripoll Agullo |
| 2014/0270930 A1 | 9/2014 | Grushkowitz |
| 2014/0318605 A1 | 10/2014 | Huzyak et al. |
| 2014/0360552 A1 | 12/2014 | Britcher et al. |
| 2015/0101996 A1 | 4/2015 | Nayar |
| 2015/0104239 A1 | 4/2015 | Schaefer et al. |

FOREIGN PATENT DOCUMENTS

| | | |
|---|---|---|
| DE | 29908190 U1 | 8/1999 |
| DE | 10336145 A1 | 3/2005 |
| DE | 102004049595 B3 | 3/2006 |
| DE | 102010005194 A1 | 9/2010 |
| DE | 102012202256 A1 | 5/2013 |
| DE | 202013005668 U1 | 10/2014 |
| EP | 2549198 B1 | 12/2013 |
| JP | 2006278738 A | 10/2006 |
| WO | 2015024542 A1 | 2/2015 |

OTHER PUBLICATIONS

First Action Interview Pilot Program Pre-Interview Communication dated Jun. 7, 2018 in U.S. Appl. No. 15/092,610, filed Apr. 6, 2016. 4 pages.

First Action Interview Pilot Program Pre-Interview Communication dated Jun. 12, 2018 in U.S. Appl. No. 15/094,887, filed Apr. 8, 2016. 4 pages.

First Action Interview Office Action Summary dated Oct. 19, 2018 in U.S. Appl. No. 15/092,610, filed Apr. 6, 2016. 25 pages.

First Action Interview Office Action Summary dated Nov. 16, 2018 in U.S. Appl. No. 15/094,887, filed Apr. 8, 2016. 5 pages.

First Action Interview Office Action Summary dated Nov. 19, 2018 in U.S. Appl. No. 15/092,602, filed Apr. 6, 2016. 22 pages.

Final Office Action dated Mar. 6, 2019 in U.S. Appl. No. 15/092,610, filed Apr. 6, 2016. 21 pages.

\* cited by examiner

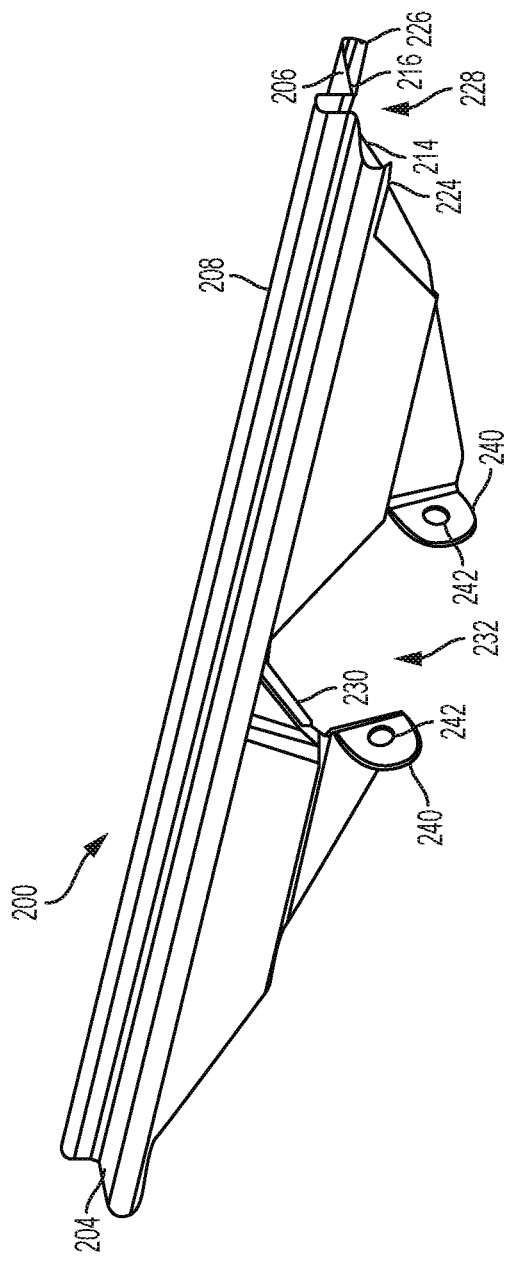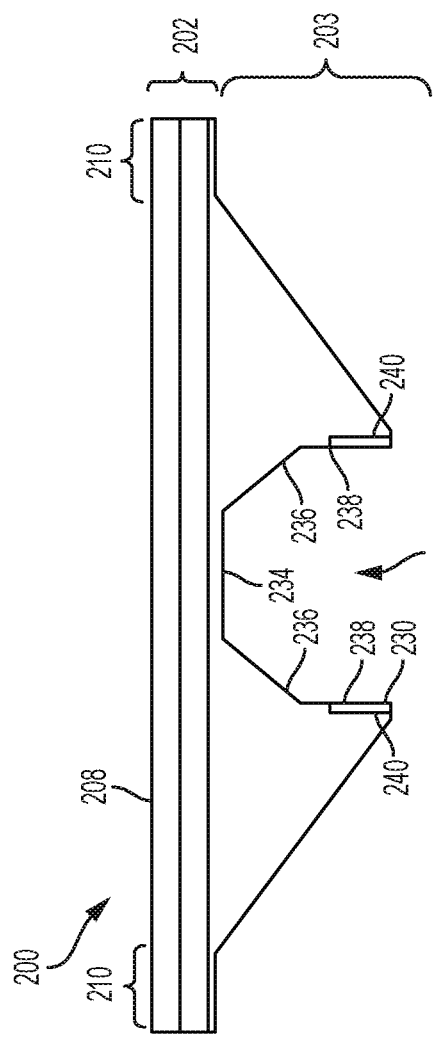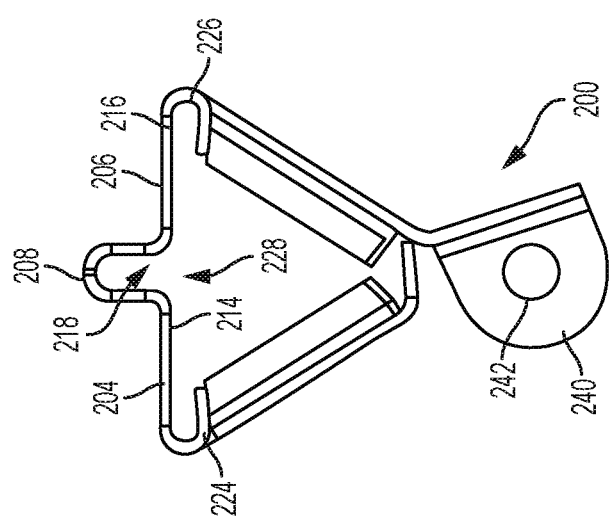

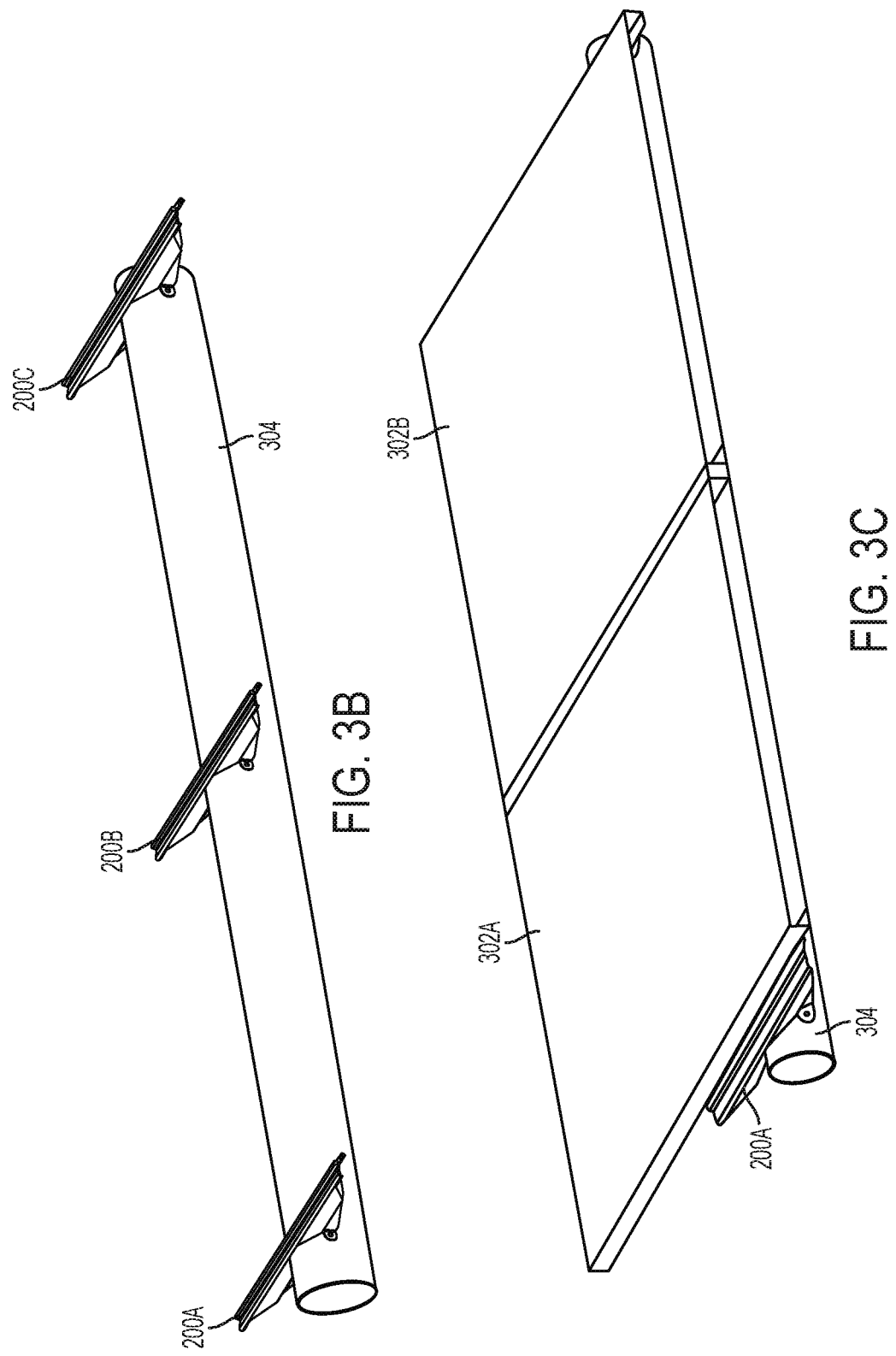

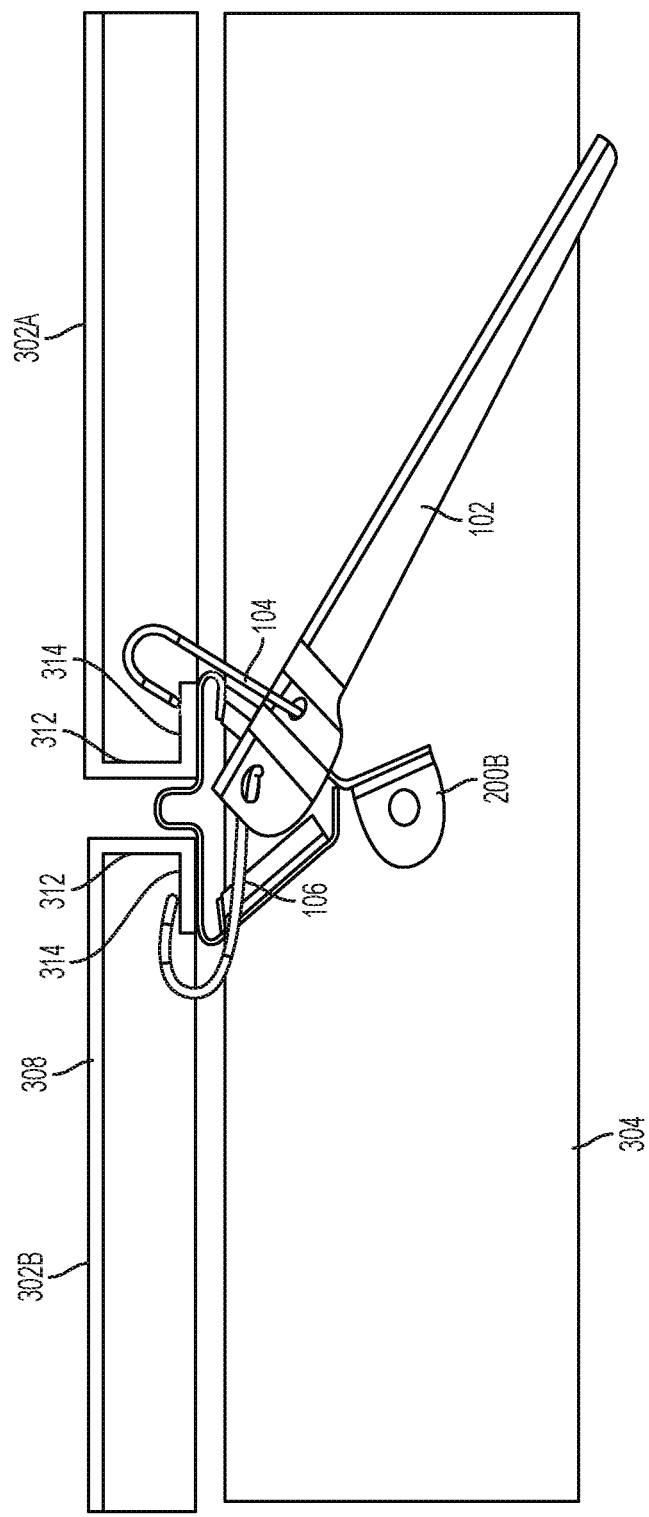

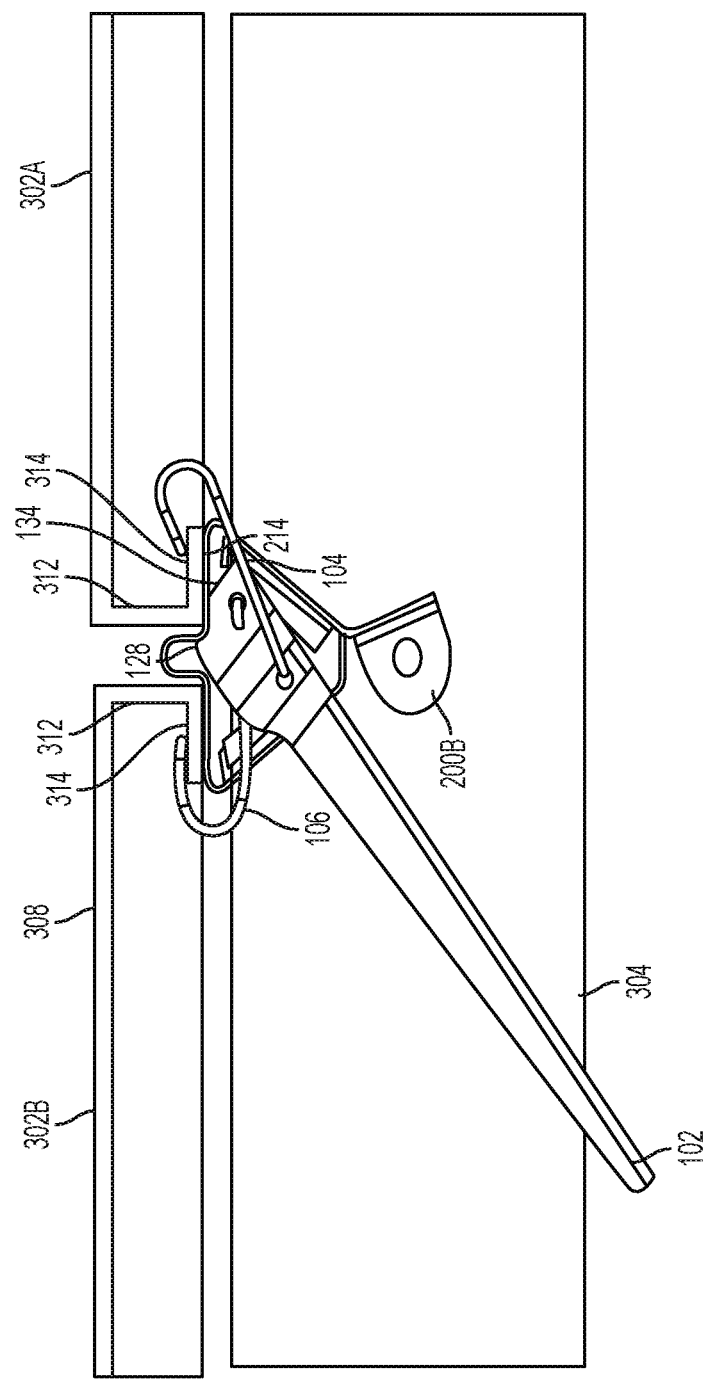

OVER-CENTER UNDER PHOTOVOLTAIC MODULE CLAMP

TECHNICAL FIELD

The present invention relates to photovoltaic modules and photovoltaic tracker arrays assembled therefrom.

BACKGROUND OF THE INVENTION

Solar trackers are used to rotate photovoltaic (PV) modules to keep them perpendicular to the direct rays of the sun. Keeping the PV modules, as part of an array, at this orientation increases or optimizes the amount of energy that can be generated by the array, because energy generated by the array drops off with the cosine of the angle of incidence of solar rays on the surface of the array. Because they are usually ground mounted and require row-to-row spacing, trackers are typically used in medium to large sized arrays (e.g., ≥1 megawatt). Although trackers add an additional cost per watt over fixed ground-mount systems, the cost is typically recouped on larger arrays.

In a single-axis tracker, photovoltaic modules are suspended above the ground in one or more horizontal rows, connected to a beam known as a torque tube. The torque tube, generally oriented along a North-South axis, is attached to a drive mechanism actuated by a controller to incrementally rotate the photovoltaic array in place over the course of the day to maintain a relatively constant angle with the sun as the sun progresses through the sky.

Some more sophisticated trackers known as dual-axis trackers not only rotate modules from East-to-West but also tilt modules towards the equator. With these trackers, modules are usually clustered together in individual sections, spaced apart from one another since they have to have greater spacing due to intra-row shading (shading of one section by an adjacent section in the same row), as well as inter-row shading (shading of one row by the adjacent row).

Because tracker arrays require very little post installation maintenance, the viability of these projects often turns on the projected rate of return derived from comparing the fixed value of the energy generated over the lifetime of the system versus the upfront costs of installation. In a multi-megawatt project, cost reductions of pennies per watt can be the difference between a project being viable or too expensive. Therefore, tracker designers are always seeking innovations to lower installation and hardware costs.

Accordingly, there remains a need for photovoltaic module assembly hardware that can make installation of solar tracker arrays more efficient and cost effective.

BRIEF SUMMARY OF THE INVENTION

In various aspects, the present disclosure provides for: clamps and corresponding photovoltaic (PV) module brackets (also referred to as a bracket); a section of a PV array having brackets mounted onto a torque tube and PV modules mounted onto the brackets with clamps; and a method of assembling a section of a PV tracker array.

Various embodiments of the invention provide new and improved methods and systems for attaching solar panels to a torque tube of a solar tracker. Various embodiments will reduce costs and increase installation speed over conventional methods and systems. These and other embodiments are shown and discussed in greater detail in the figures and corresponding detailed description.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive.

FIG. 2A shows a perspective view of a PV module mounting bracket, according to aspects of the disclosure.

FIG. 2B shows an end view of a PV module mounting bracket, according to aspects of the disclosure.

FIG. 2C shows a profile view of a PV module mounting bracket, according to aspects of the disclosure.

FIGS. 3B-3H shows intermediate stages of assembly of an array with PV modules, clamps, brackets and a torque tube, according to aspects of the disclosure.

DETAILED DESCRIPTION OF THE INVENTION

Throughout this description for the purposes of explanation, numerous specific details are set forth in order to provide a thorough understanding of the many aspects and embodiments disclosed herein. It will be apparent, however, to one skilled in the art that the many aspects and embodiments may be practiced without some of these specific details. In other instances, known structures and devices are shown in diagram or schematic form to avoid obscuring the underlying principles of the described aspects and embodiments.

Solar arrays that track the daily movement of the sun typically include one or more rows of photovoltaic modules, sometimes referred to as solar panels, that are attached to contiguous sections of pipe, referred to as torque tube. A drive motor rotates the torque tube in accordance with a predetermined algorithm to keep the attached PV modules "on sun", in other words substantially perpendicular to direct solar radiation. These types of solar trackers are referred to as single axis trackers arrays. Single axis tracker arrays may include a drive motor on each torque tube, or alternatively a common drive assembly that interconnects multiple torque tubes to rotate them simultaneously. Spacing between rows of torque tubes is sometimes necessary to allow the PV modules to freely rotate without interference from PV modules in adjacent rows and also to prevent inter-row shading.

Mounting photovoltaic modules to mounting brackets on torque tubes must be done in a secure way that is both strong and will last for many years with little to no maintenance.

Conventional methods of mounting PV modules to brackets can be time consuming, require specialized or heavy equipment, or require precise placement of mounting brackets. The present disclosure includes a clamp for attaching PV modules to a torque tube including brackets. The clamp secures PV modules to the brackets in an efficient. Specifically, PV modules are placed on opposite sides of a bracket, and a clamp is used to secure the two PV modules simultaneously, thus saving time and eliminating the need for tools. This timesavings significantly reduces the amount of time spent by installation crews at installation sites.

Figure 1A:
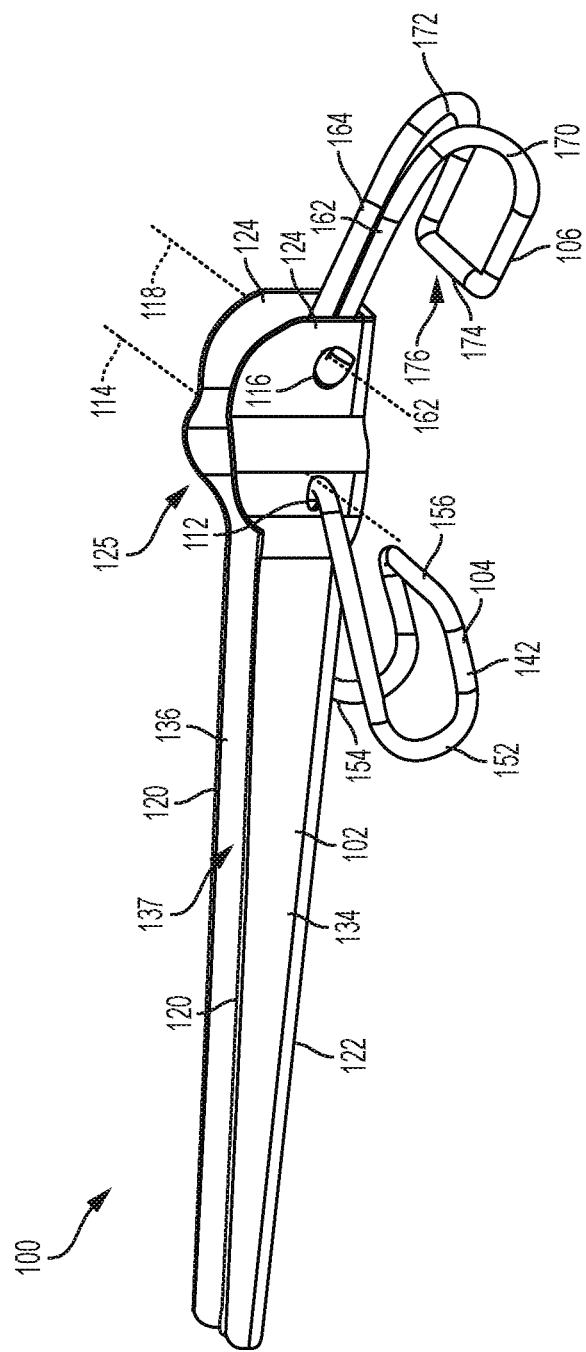
FIG. 1A shows a perspective view of a PV module clamp, according to aspects of the disclosure.
Figure 1B:
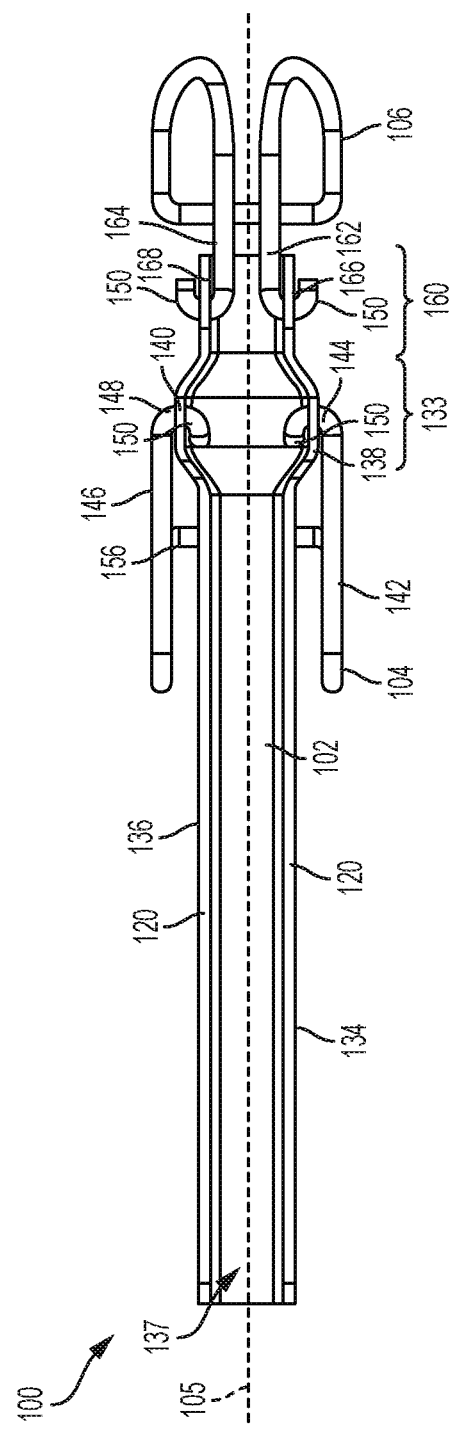
FIG. 1B shows a top view of a PV module clamp, according to aspects of the disclosure.
Figure 1C:
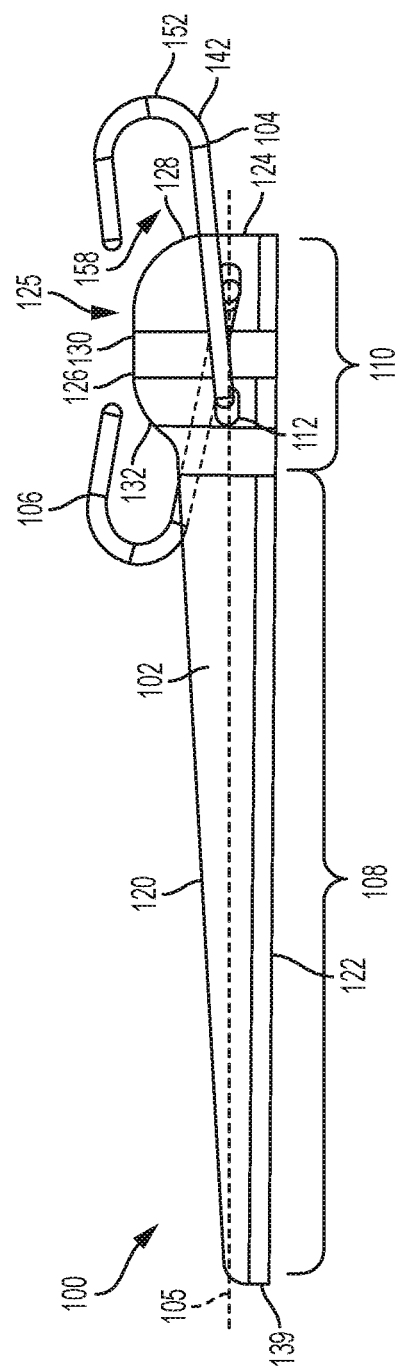
FIG. 1C shows a profile view of a PV module clamp, according to aspects of the disclosure.

FIG. 1A shows a perspective view of PV module clamp 100 in a first configuration, FIG. 1B shows a top view of clamp 100 in the first configuration, and FIG. 1C shows a profile view of clamp 100 in a second configuration. Clamp 100 can include main body 102, first hook 104 rotatably attached to main body 102, and second hook 106 rotatably attached to main body 102. Main body 102 can be an elongated body, having longitudinal axis 105 along the length of the elongated body, and can include handle 108 and clamp end 110. In embodiments, handle 108 can be from 100 mm to 300 mm long, and clamp end 110 from 50 mm to 100 mm long. Clamp end 110 can include first apertures 112, which can receive portions of first hook 104 and define a first axis of rotation 114 which first hook 104 can be rotated about. Clamp end 110 can further include second apertures 116, which can receive portions of second hook 106 and define second axis of rotation 118 which second hook can be rotated about. First axis of rotation 114 and second axis of rotation 118 can be separated by a distance along longitudinal axis 105 of main body 102. In embodiments, the distance between first axis of rotation 114 and second axis of rotation 118 can be between 25 mm and 90 mm.

Main body 102 can further include top side 120 and bottom side 122, and opposite top side 120. Top side 120 and bottom side 122 can run generally parallel to longitudinal axis 105 of main body 102. Clamp end 100 can include end surface 124 extending from bottom side 122 toward top side 120. A portion of top side 120 of clamp end 110 can include rocker portion 125 including rocker surface 126. Rocker surface 126 can include first curved surface 128 extending from, and contiguous with, end surface 124, flat top surface 130 extending from first curved surface 128 toward handle 108 and generally parallel to longitudinal axis 105 of main body 102, and second curved surface 132 extending from, and contiguous with, flat top surface 130.

Main body 102 can include a generally U-shaped cross-section perpendicular to longitudinal axis 105 of main body 102. U-shaped cross-section can be defined by bottom side 122, first sidewall 134 extending from bottom side 122 toward top side 120, and second sidewall 136 extending from bottom side 122 toward top side 120, opposite first sidewall 134. Bottom side 122, first sidewall 134, and second sidewall 136 define channel 137 along the length of main body 102. As shown, first sidewall 134 and second sidewall 136 can have equal heights that vary along longitudinal axis 105 of main body 102. As shown, handle end 108 includes a tapered profile with first sidewall 134 and second sidewall 136 having a greater height where handle 108 meets clamp end 110 than at distal end 139 of handle 108. Further, at clamp end 110, first sidewall 134 and second sidewall 136 can have heights greater than first sidewall 134 and second sidewall 136 at handle 108, which correspond to features of rocker portion 125.

Clamp end 110 can include first hook section 133 including first bump out 138 of first sidewall 134 and second bump out 140 of second sidewall 136. First bump out 138 can include first aperture 112, and second bump out 140 can include first aperture 112.

First hook 104 can include first leg 142 including first hinge axle 144 that can be received in first aperture 112 of first bump out 138 so first leg 142 rotates about an outside surface of first sidewall 134. Further first hook 104 can include second leg 146 including second hinge axle 148 that can be received in first aperture 112 of second bump out 140 so second leg 146 rotates about an outside surface of second sidewall 136. As shown in FIG. 1B first hinge axle 144 and second hinge axle 148 can include retainer tabs 150 located within channel 137 and preventing first hinge axle 144 and second hinge axle 148 from being unintentionally pulled through first apertures 112.

First leg 142 can include a first hooked portion 152, and second leg 146 can include a second hooked portion 154. First hooked portion 152 and second hooked portion 154 can be connected with a first end connector 156. First hooked portion 152, second hooked portion 154, and first end connector 156 define a first hook cavity 158.

Clamp end 110 can further include a second hook section 160 between end surface 124 and first hook section 133. Second hook 106 can include third leg 162 and fourth leg 164. Third leg 162 can include third hinge axle 166 that can be received in second aperture 116 of second hook section 160 of first sidewall 134 so third leg 162 rotates about an inside surface of first sidewall 134. Further, fourth leg 164 can include fourth hinge axle 168 that can be received in second aperture 116 of second hook section 160 of second sidewall 136 so fourth leg 146 rotates about an inside surface of second sidewall 136. As shown, third hinge axle 166 and fourth hinge axle 168 can include retainer tabs 150 located outside of first sidewall 134 and second sidewall 136 which prevent third hinge axle 166 and fourth hinge axle 168 from being unintentionally pulled through second apertures 116.

Third leg 162 can include third hooked portion 170, and fourth leg 164 can include fourth hooked portion 172. Third hooked portion 170 and fourth hooked portion 172 are connected with second end connector 174. Second end connector 174 can be the same length as first end connector 156. Third hooked portion 170, fourth hooked portion 172, and second end connector 174 define second hook cavity 176.

As shown in in FIG. 1B, because of first bump out 138 and second bump out 140, channel 137 can have a varying width. The varying width can allow first hook 104 to rotate about the outside of main body 102 without interference from retainer tabs 150 of second hook 106. Further, the varying width can allow second hook 106 to rotate to positions within channel 137 without interfering with retainers tabs 150 of first hook 104 located within portion of channel 137 corresponding to first hook portion 133.

First hook 104 and second hook 106 can be rotated between the first configuration, shown in FIGS. 1A and 1B, and the second configuration, shown in FIG. 1C. In the first configuration, first leg 142 and second leg 146 of first hook 104 extend from first apertures 112 in a direction toward handle 108 and away from bottom side 122. In first configuration, third leg 162 and fourth leg 164 of second hook 106 extend from second apertures 116 in a direction away from end surface 124 and away from bottom side 122.

In second configuration, first leg 142 and second leg 146 of first hook 104 extend from first apertures 112 in a direction away from end surface 124 and away from top side 120. Further, in second configuration, third leg 162 and fourth leg 164 of second hook 106 include portions located with channel 137, and third leg 162 and fourth leg 164 extend from second apertures 116 toward handle 108. In the second configuration, first hook 104 and second hook 106 can include portions which cross, as shown in FIG. 1C.

FIG. 2A shows a perspective view of a PV mounting bracket 200 configurable to be mounted to a torque tube and to support two PV modules to be secured to bracket 200 and torque tube 304 with clamp 100. Bracket 200 can include PV module support portion 202, for mounting PV modules to bracket 200, and saddle portion 203, for mounting bracket 200 to a torque tube.

PV module support portion 202 can include first ledge 204, second ledge 206, and spine 208 between first ledge 204 and second ledge 206. In use, first ledge 204 and second ledge 206 can each support a portion of the frame of one PV module. Spine 208 can prevent supported PV modules from contacting each other. First ledge 204 and second ledge 206 can each be generally contiguous flat surfaces, however in embodiments first ledge 204 and second ledge 206 can each include multiple coplanar sections. As shown, first ledge 204 and second ledge 206 can be coplanar so PV modules supported on each ledge are coplanar.

PV module portion 202 can further include clamp portion 210 including end portions of first ledge 204, second ledge 206, and spine 208. In embodiments, bracket 200 can include two clamp portions 210. Clamp portion 210 can include a contact surface including a first contact surface 214 and a second contact surface 216. First contact surface 214 can be located opposite first ledge 204 and can face a direction opposite the direction first ledge 204 faces. Second contact surface 216 can be located opposite second ledge 206 and can face a direction opposite the direction second ledge 206 faces. As shown in FIG. 2B, first contact surface 214 and second contact surface 216 can be separated by a gap 218 formed by spine 208. However, in embodiments, first contact surface 214 and second contact surface 216 can be contiguous. First contact surface 214 and second contact surface 216 can be coplanar.

PV module portion 202 further includes first tab 224 extending from a side of first ledge 204 opposite spine 208, and second tab 226 extending from a side of second ledge 206 opposite spine 208. As shown in FIG. 2B, first tab 224 and second tab 226 can each initially extend toward saddle portion 203, and can each include a bend toward spine 208. First tab 224, second tab 226, first contact surface 214, and second contact surface 216 define channel 228. Channel 228 can be sized to receive rocker portion 125 of clamp 100.

Saddle portion 203 can be substantially trapezoidal in shape. Saddle portion 203 can include recess edge 230 forming torque tube recess 232. As shown in FIG. 2C, torque tube recess 232 can include top portion 234, diagonal portions 236, and side portions 238 oriented to receive a round torque tube. In embodiments, torque tube recess 232 can be formed into other shapes as well. For example torque tube recess 232 can be round corresponding to use with a round torque tube. Further for example, torque tube recess 232 can be shaped to receive and match the shape of torque tubes with square cross sections. Bracket 200 brackets may be configured so that torque tube recess 232 exerts a restoring spring-like force when fit and stretched over the exterior surface of a torque tube which assists with balancing bracket 200 on torque tube.

As shown in FIG. 2A-C, ends of torque tube recess 232 edge can include pair of attachment tabs 240, including apertures 242 that can match up with holes fabricated in a torque tube. As shown, attachment tabs 240 extend away from bracket 200 in the same direction. In embodiments, attachment tabs 240 can extend away from bracket 200 in opposite directions. Apertures 242 can be configured to receive rivets, screws, bolts, or other fasteners to attach bracket 200 to torque tube.

In embodiments, bracket may be attached to torque tube with fastening methods other than attachment tabs. For example, brackets can attach to torque tube through use of tab or projection structure extending from brackets into holes formed in the wall of a torque tube. Further, bracket can include an alignment tab on one side of torque tube recess and a single attachment tab, for a rivet, on the other side of torque tube recess. Further, for example, bracket may include hooks configured to receive a toggling clamp to secure bracket to a torque tube.

In embodiments, bracket 200 can be made up of multiple separate components. For example, bracket 200 can include a first portion including first ledge and first saddle portion, and a separate second portion including a second ledge and a second saddle portion. First portion and second portion may each be placed on a torque tube to create a complete bracket, which can then be used with clamp technology disclosed herein.

As shown in FIG. 2A-C, bracket 200 is generally symmetrical. However, in embodiments, bracket may not be symmetrical. The size of the bracket can be based on the size of PV modules and the size of a torque tube. In embodiments, the length of bracket in a direction through clamp sections can be from about two hundred millimeters to about one thousand millimeters (200 mm-1000 mm), or a length of any increment or gradient thereof.

Figure 3A:
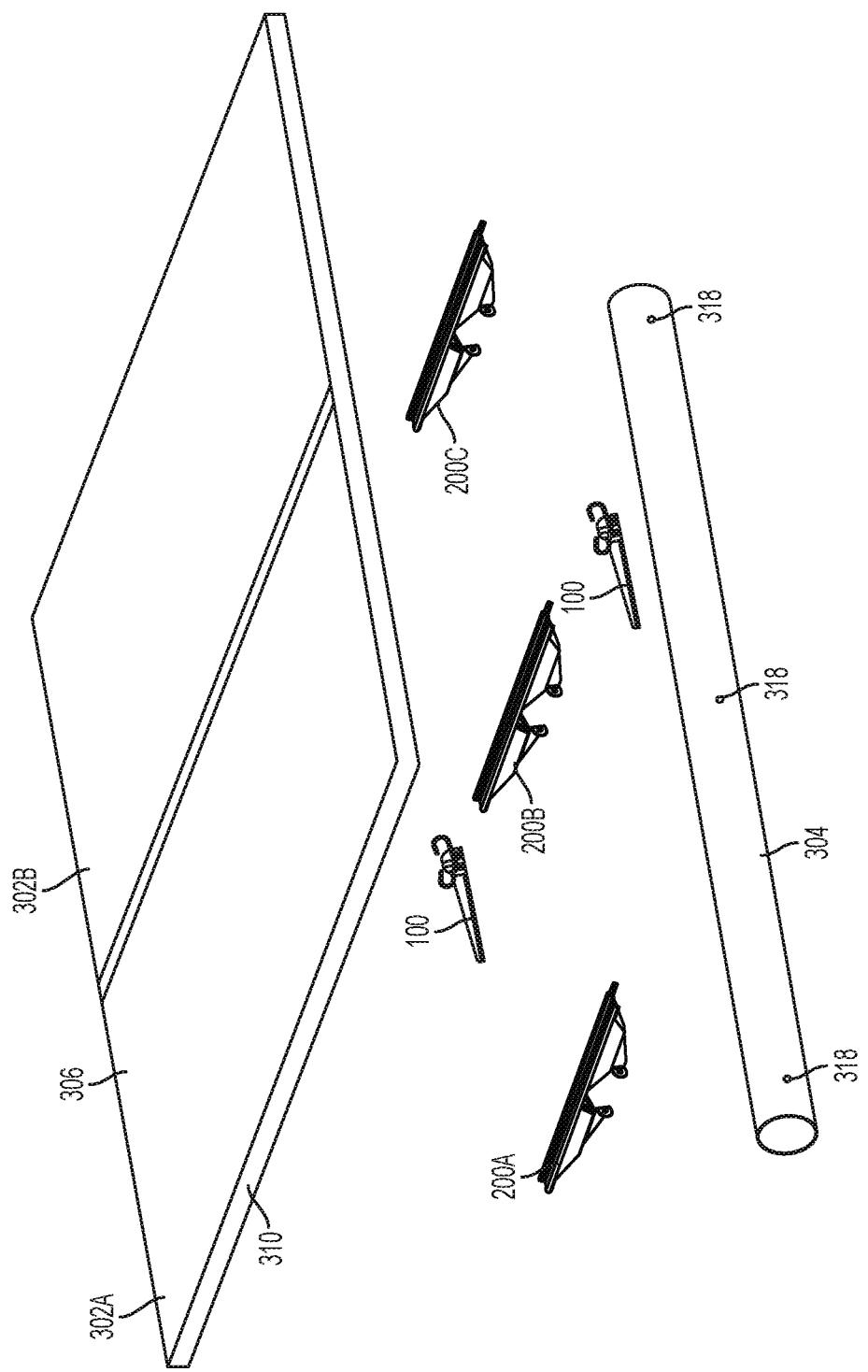
FIG. 3A shows an exploded view of a section of a PV array with PV modules, PV module clamps, PV module mounting brackets and a torque tube, according to aspects of the disclosure.

FIG. 3A shows an exploded view of a section of photovoltaic array which can include two PV modules 302, torque tube 304, two PV module clamps 100, and three PV module mounting brackets 200. PV module 302 can include top side 306, which can include PV cells 308 configured to face the sun to absorb photons, and a bottom side 307, opposite top side 306, which when installed in a PV array faces the torque tube and can include power distribution elements. PV module 302 can be rectangular, having a long edge and a short edge, and as considered herein, photovoltaic modules can be rectangular modules as known in the industry, including but not limited to, 60-cell PV modules, 72-cell PV modules, 80-cell PV modules, 96-cell PV modules, and the like. Generally, for any given photovoltaic array section, photovoltaic modules will be the same size, operate at the same voltage, and generate the same amount of power, such that no individual photovoltaic module of photovoltaic array section becomes an operational drag on the other photovoltaic modules.

PV module 302 can include frame 310 around the periphery of PV module 302. Frame 310 can include side wall 312 and bottom wall 314. When installed, outer surface of bottom wall 314 can contact first ledge 204 or second ledge 206 of PV module mounting bracket 200, and outer surface of side wall 312 can face spine 208 of bracket 200. Bottom side 307 of PV module 302, inner side of side wall 312, and inner side of bottom wall 314 define channel 316 which can receive first hook 104 or second hook 106 of clamp 100.

Torque tube 304 can include receiving holes 318 along the length of torque tube 304 positioned laterally proximate to the horizontal axis of symmetry of torque tube 304, and on both (opposing) sides of torque tube 304. Receiving holes 318 can be spaced to receive rivets through attachment tabs 240 of bracket 200.

FIG. 3B shows photovoltaic array section at an initial stage of installation, including torque tube 304 and three brackets 200A, 200B, and 200C mounted to torque tube 304 with rivets through receiving holes 318 in torque tube 304. Brackets 200A 200B and 200C are spaced apart so that the space between spines 208 of sequential brackets corresponds to the width of PV module 302. FIG. 3C shows photovoltaic array section at an intermediate stage of installation, after initial stage shown in FIG. 3B. As shown in FIG. 3C, first PV module 302A is rested on the second ledge 206 of first bracket 200A and first ledge 204 of second bracket 200B, so that portions of outer side of bottom wall 314 of frame 310 of first PV module 302A contact ledges of brackets 200A and 200B. Second PV module 302B is rested on second ledge 206 of second PV module bracket 200B and first ledge 204 of third bracket 200C, so that portions of outer side of bottom wall 314 of frame 310 of second PV module 302B contact ledges of second bracket 200B and third bracket 200C. PV modules 302A and 302B can be slid so that the middle portions of the PV modules are aligned over torque tube 304 so that the modules are balanced and create a net zero torque on the torque tube when unloaded and in a horizontal position relative to the ground.

To secure PV modules 302A and 302B to second bracket 200B, handle end 108 of clamp 100 is rotated until clamp 100 is position in a locked position relative to bracket 200B. FIGS. 3D-3G show a series of sequential intermediate positions of clamp 100 from an initial engagement configuration to a locked position.

Figure 3D:
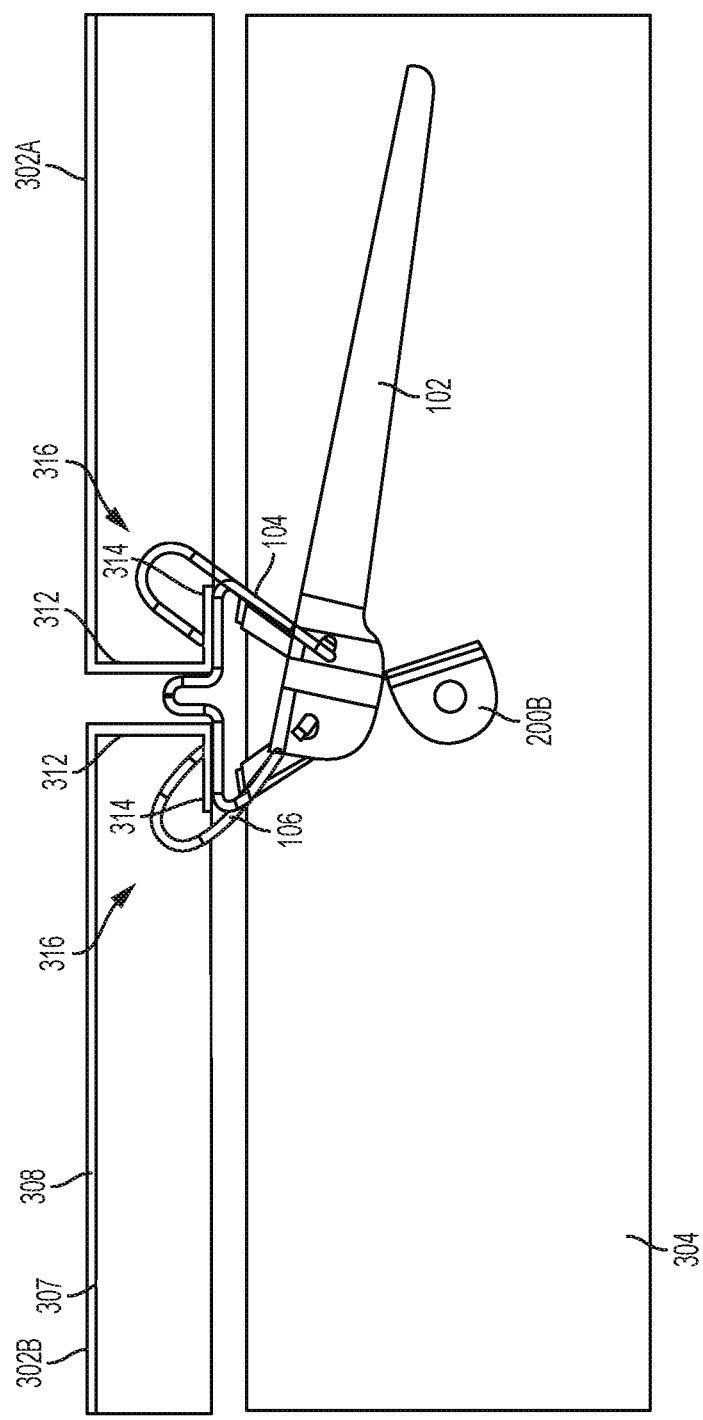

FIG. 3D shows photovoltaic array section at an intermediate stage of installation after the intermediate stage of FIG. 3C. FIG. 3D shows clamp 100 in an initial engagement configuration where clamp 100 can be positioned under PV modules 302A and 302B which are supported on first ledge 204 and second ledge 206 of second PV module mounting bracket 200B. Bottom side 122 of clamp 100 is facing toward first contact surface 214 and second contact surface 216 of second bracket 200B. In the initial engagement configuration, first end connector 156 of first hook 104 can be positioned within channel 316 of frame 310 of first PV module 302A. Further, in initial engagement position, second end connector 174 of second hook 106 can be positioned within channel 316 of frame 310 of second PV module 302B. Also, in initial engagement configuration, main body 102 can hang from first hook 104 and second hook 106 without contacting second bracket 200B. In initial engagement configuration, no clamping force may be present between bracket and hooks of PV module clamp 200. Further, in initial engagement configuration, first hook 104 and second hook 106 can be positioned so that no portions of first hook 104 and second hook 106 are crossed.

FIG. 3E shows a photovoltaic array section at a second intermediate stage of installation, after the first intermediate stage of FIG. 3D. As shown in FIG. 3E, if a force is applied to handle 108, handle 108 can be caused to rotate away from first PV module 302A. In the perspective of FIG. 3E, the rotation is clock-wise although that is a matter of perspective. Main body 102 can rotate about a combination of first axis of rotation 114 and second axis of rotation 118 at different points during rotation. Further, first axis of rotation 114 and second axis of rotation 118 can each change position relative to second bracket 200B during rotation.

Figure 3F:
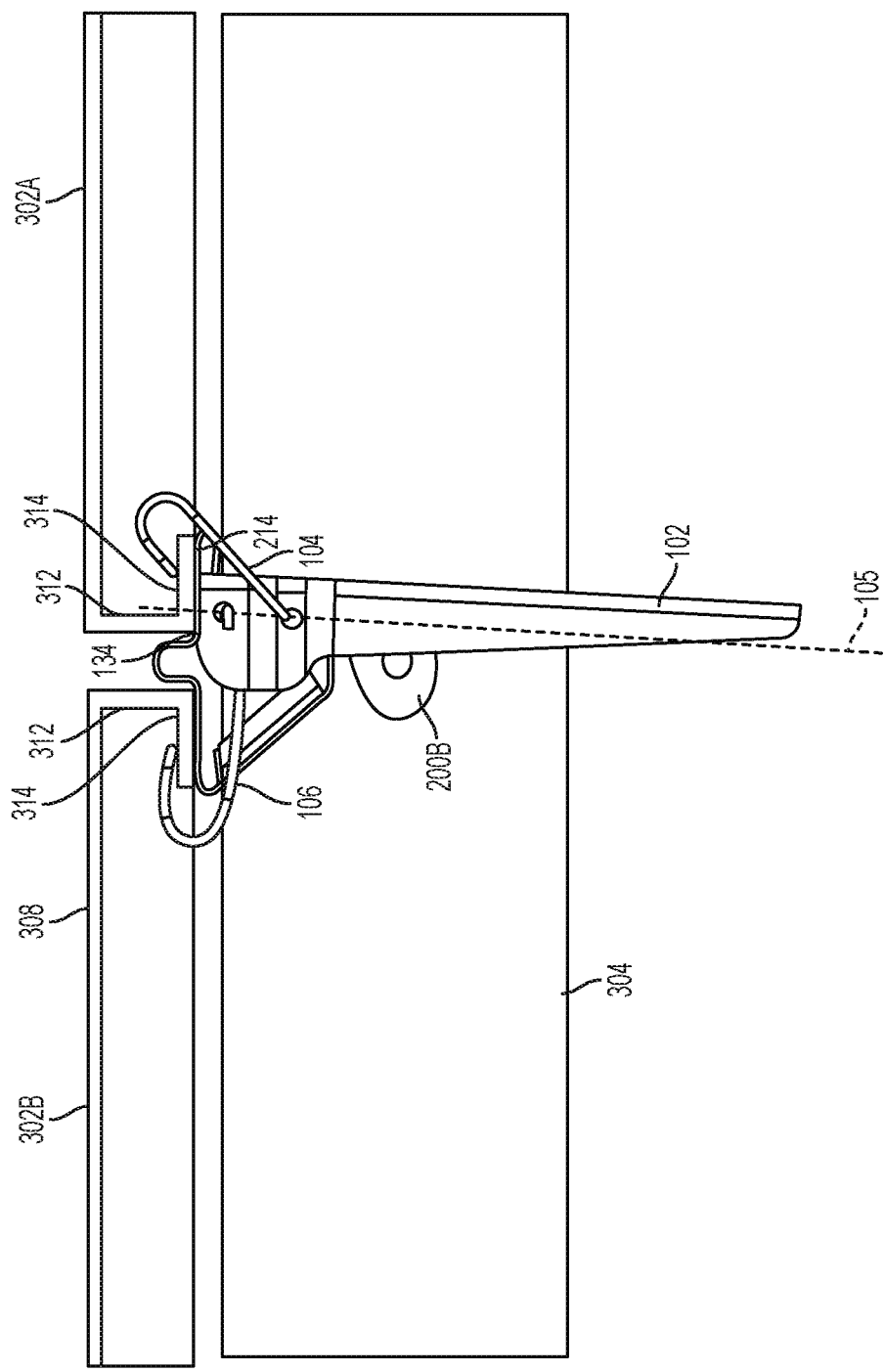

FIG. 3F shows photovoltaic array section at a further intermediate stage of installation, after the intermediate stage of FIG. 3E. As shown in FIG. 3F, handle 108 can be rotated so that longitudinal axis 105 of main body 102 is substantially perpendicular to torque tube 304. As shown, end surface 124 can contact and engage first contact surface 214 of second bracket 200B.

FIG. 3G shows photovoltaic array section at yet a further intermediate stage of installation after the intermediate stage of FIG. 3F. As shown in FIG. 3G, as rotation continues, main body 102 can pivot on first contact surface 214 from end surface 124 to first curved surface 128 of rocker portion 125. Engagement of the rocker surface 126 with first contact surface 214 and second contact surface 216 of second bracket 200B can cause clamp 100 to exert clamping forces that pull bottom walls 314 of frames 310 of PV modules 302A and 302B toward first ledge 204 and second ledge 206 of second bracket 200B.

The shape of rocker portion 125, shape/size of first hook 104 and second hook 106, and the location of first axis of rotation 114 and second axis of rotation 118 on main body 102 are configured to cause clamping forces to increase as clamp 100 is rotated toward the locked position. The clamping forces reach a peak force at a position between initial engagement configuration and locked position just before the locked position. As main body 102 rotates toward the peak force, a biasing force opposing the direction of rotation toward the peak increases, which biases main body toward initial engagement configuration. Once main body rotates past the peak, the biasing force changes direction and biases the main body to continue rotating toward the locked position. This principle can be referred to as bistability, because prior to reaching the peak main body is biased toward a first stable position toward initial engagement configuration, and after the main body passes the peak, i.e. goes "over center", the main body is biased toward a second stable position in the direction of the locked position.

Figure 3H:
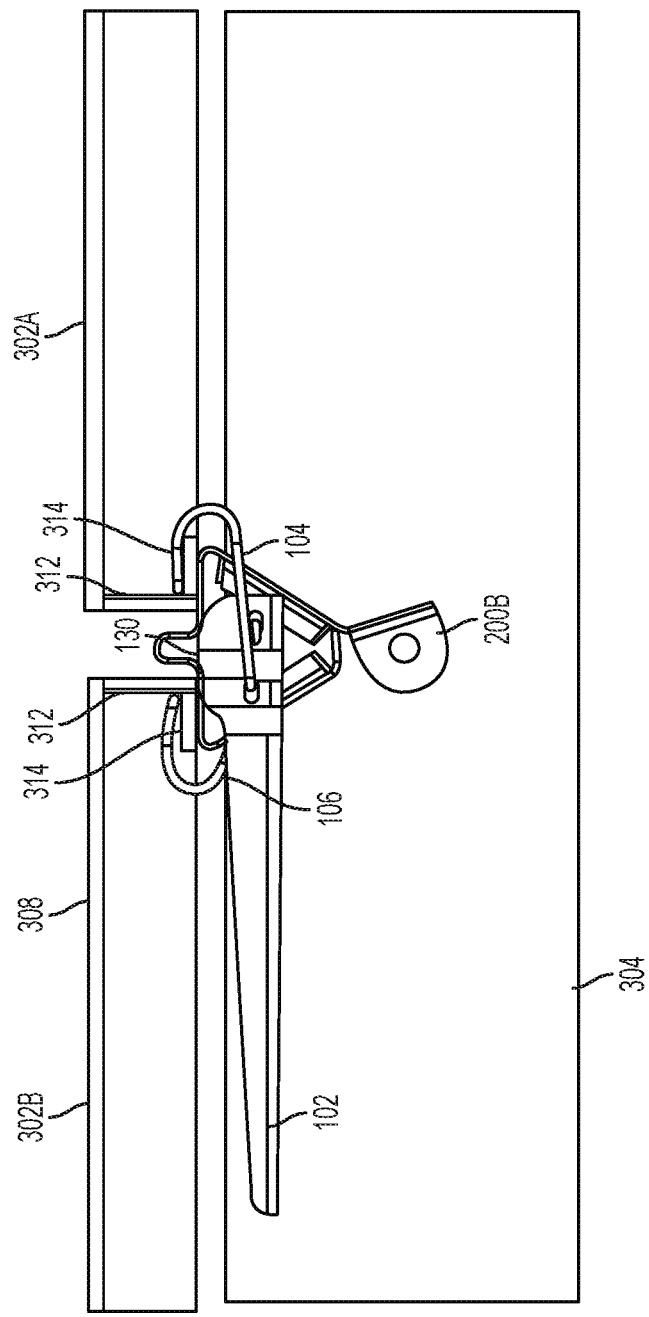

FIG. 3H shows a photovoltaic array section at the final stage of installation after the intermediate stage of FIG. 3G. As shown in FIG. 3H, clamp 100 is in a locked position. In the locked position, flat top surface 130 can contact first contact surface 214 and second contact surface 216 of bracket 200B. In the locked position, clamp 100 is positioned in a stable position and is not biased toward rotating in a direction toward initial engagement position. This stable "over center" position is beneficial because it biases clamp 100 into the locked position, and thus prevents clamp 100 from rotating in a direction that would unsecure PV modules.

As shown in FIG. 3H, in the locked position, second hook 106 can include portion within channel 137 of clamp 100 and third hooked portion and fourth hooked portion of second hook 106 can be locate outside of channel 137. Further as shown, in locked position, first and second hook can include portions that are crossed.

In embodiments, during installation, PV modules may be placed on ledges of brackets so that a sufficient gap is present between frames and spine to allow for thermal expansion of PV modules. Further, ledges of bracket may be sized to be wide enough to account for thermal contraction of PV modules so that PV modules are still supported on ledges when thermally contracted.

Figure 4:
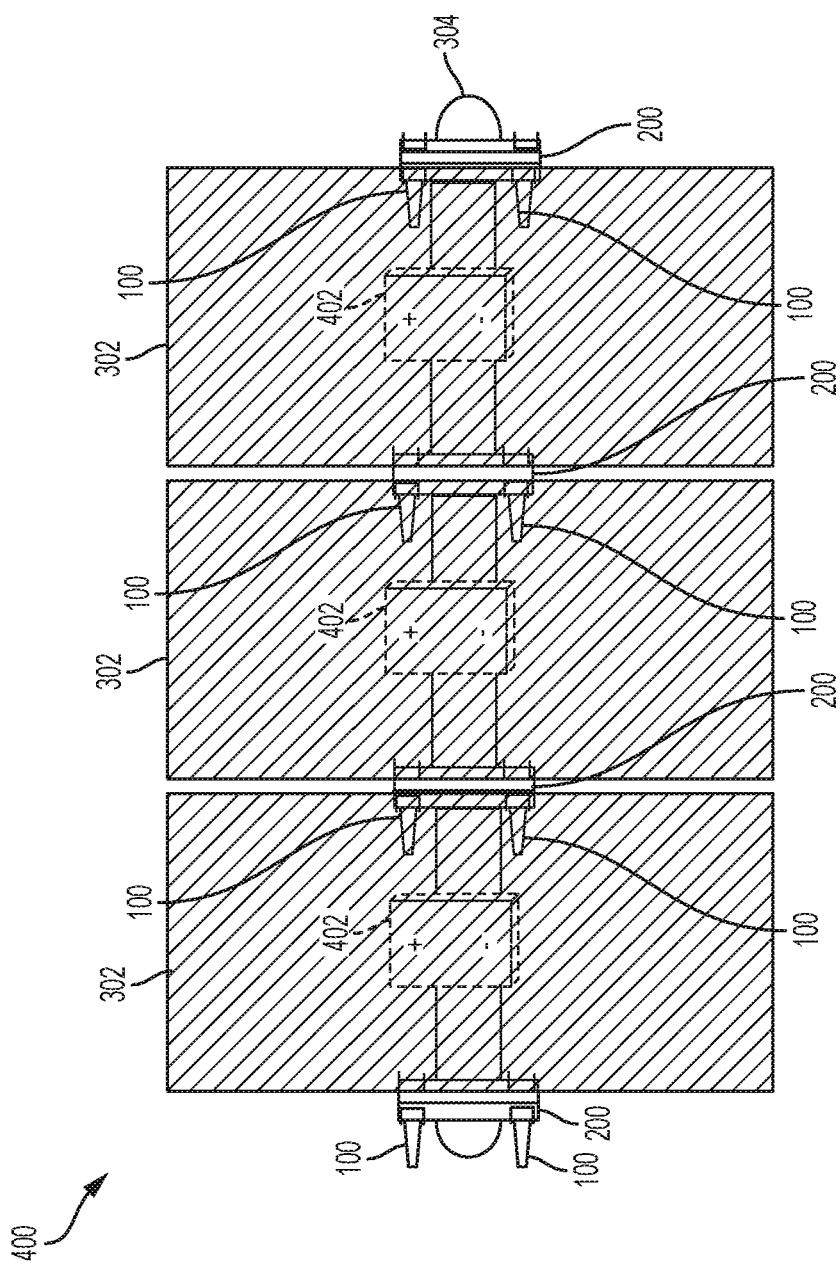
FIG. 4 shows a schematic plan view representation of a section of a PV array with PV modules mounted to PV module mounting brackets on a torque tube with PV module mounting clamps, according to embodiments of the disclosure.

FIG. 4 shows a schematic representation of PV array section 400 including three PV modules 302 mounted to torque tube 304. As part of photovoltaic array section 400, PV modules 302 can include junction boxes 402. Junction boxes can be attached to PV modules prior to mounting to brackets 200 or after mounting to brackets. Junction boxes 602 provide positive and negative leads used to relay the solar energy collected by the photovoltaic cells. Junction boxes 602 are oriented on adjacent PV modules assemblies 302 so that the polarities are aligned to be efficiently wired and conduct electricity. As shown in FIG. 4, in embodiments clamp 100 may be used to secure PV module 302 to PV module mounting bracket 200 supporting only a single PV module 302. As shown, either first hook 104 or second hook 106 can be placed on empty first ledge 204 or second ledge 206 of bracket 200 and the same process shown and described above in FIGS. 3D-3I1 can be used to secure PV module 302 to bracket 200 without a second PV module present.

Figure 5:
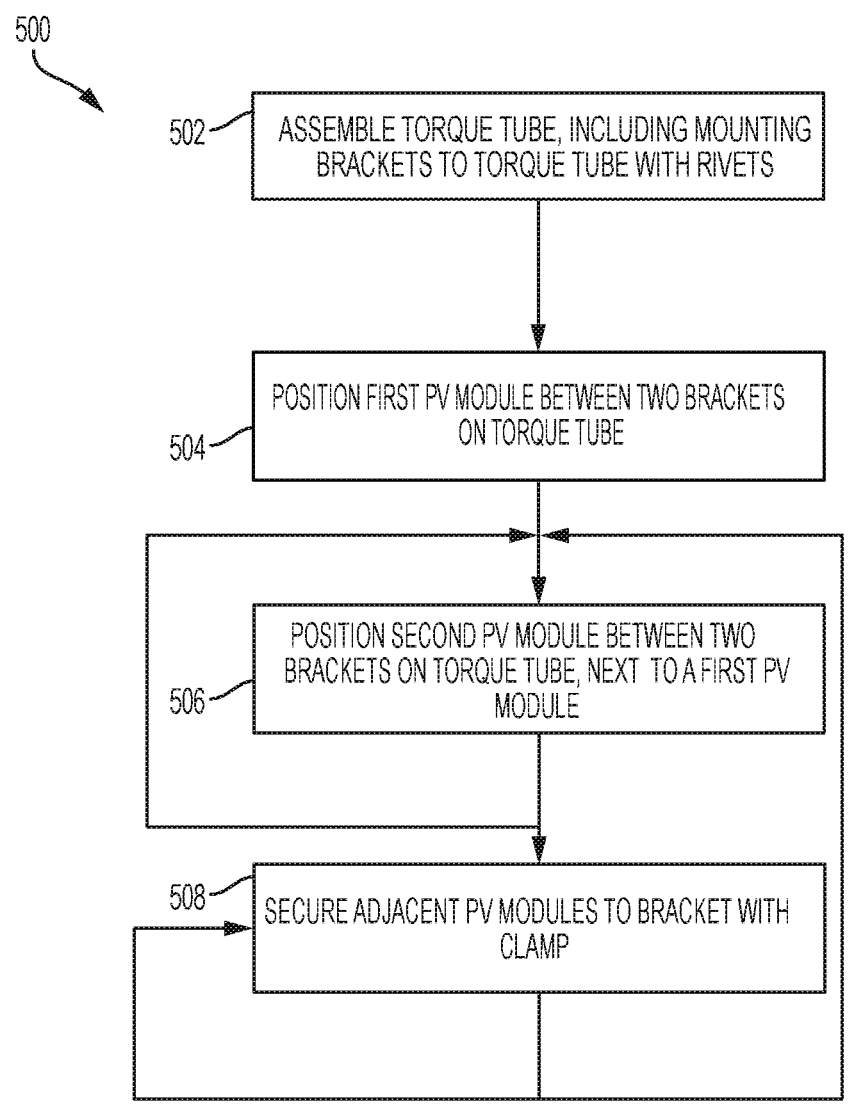
FIG. 5 shows an exemplary flowchart describing a method of assembling a PV array, according to embodiments of the disclosure.

FIG. 5 shows an exemplary flowchart 500 describing a method of assembling a photovoltaic array. At step 502, a plurality of brackets are mounted to a torque tube. The mounting can include riveting attachment tabs to receiving holes of torque tube.

At step 504, a PV module can be positioned onto two brackets on the torque tube. In embodiments, a PV module can be placed on the torque tube with the torque tube rotated to an orientation such that when correctly placed, the PV module will sit substantially parallel to the ground and have a net zero torque on torque tube. At step 506, another PV module is placed between brackets on the torque tube at a position next to an already placed PV module. Steps 506 can be repeated so that additional PV modules are placed on the torque tube in the same manner. In embodiments, prior to or after placing onto a torque tube, each PV module may have a junction box attached to the underside.

At step 508, a clamp is used to secure two adjacent PV modules resting on first and second ledges of a bracket. To secure, the clamp is rotated to a locked position. If a plurality of PV modules are unsecured, step 508 can be repeated, or alternatively step 506 may be repeated, one or more times, followed by performing step 508 one or more times. Further, step 508 can be performed twice on each pair of PV modules to secure PV modules to both ends of the PV module mounting bracket.

Brackets and clamps as disclosed herein can be constructed from materials appropriate for use with photovoltaic arrays and photovoltaic modules. Accordingly, brackets and clamps can be constructed from lightweight construction materials including, but not limited to, stainless steel, aluminum, titanium, other metals, and alloys or intermetallics thereof. In various embodiments, brackets can be formed out of a single piece of sheet metal that is stamped and bent into the appropriate shape, such as the shape shown in FIG. 2A. In alternative embodiments, brackets can also be fabricated from roll-formed metal, casting, or other such process. Brackets can be designed and constructed to withstand upwards of 305 lbs. of upforce (e.g. from the torque tube) and 375 lbs. of downforce (e.g. from the photovoltaic module). In various embodiments, the main body of the clamp can be formed out of a single piece of sheet metal that is stamped and bent into the appropriate shape, such as the shape shown in FIG. 1A. Further, in various embodiments, the first and second hooks may each be formed out of a single piece of wire bent into the appropriate shape, such as the shape shown in FIG. 1A.

In addition to tracker arrays, the brackets and/or clamps as disclosed herein can also be used for mounting PV modules in other types of PV installations, for example in fixed arrays. Such fixed arrays can include fixed tilt ground-based or roof-top mounting systems, where such systems can have individual or common tubular members to which the brackets and/or clamps can be used to attach PV modules.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, or gradients thereof, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. The invention is susceptible to various modifications and alternative constructions, and certain shown exemplary embodiments thereof are shown in the drawings and have been described above in detail. Variations of those preferred embodiments, within the spirit of the present invention, may become apparent to those of ordinary skill in the art upon reading the foregoing description. The inventors expect skilled artisans to employ such variations as appropriate, and the inventors intend for the invention to be practiced otherwise than as specifically described herein. Accordingly, it should be understood that there is no intention to limit the invention to the specific form or forms disclosed, but on the contrary, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A photovoltaic tracker array section, comprising:
   a torque tube;
   a bracket mounted to the torque tube;
   a first photovoltaic module contacting a first ledge of the bracket;
   a second photovoltaic module contacting a second ledge of the bracket, opposite the first ledge;
   a clamp including a handle, a first hook rotatably attached to the handle, and a second hook rotatably attached to the handle;
   wherein the clamp is configured to simultaneously secure the first photovoltaic module to the first ledge of the bracket with the first hook, and secure the second photovoltaic module to the second ledge of the bracket with the second hook,
   wherein the handle includes a rocker surface extending past a top side of the handle, the rocker surface including a first curved portion at a distal end of the handle, a flat portion extending from the first curved portion, and a second curved portion extending from the flat portion and toward a bottom side of the handle, opposite the top side;
   wherein the bracket includes a contact surface located opposite the first ledge and second ledge; and wherein the flat portion of the handle contacts the contact surface of the bracket.

2. The photovoltaic tracker array section of claim 1:
wherein the bracket includes a channel formed by a first tab extending away from the contact surface, a second tab extending away from the contact surface, and the contact surface; and
wherein the rocker surface is positioned within the channel with the first curved portion facing the first tab and the second curved portion facing the second tab.

3. The photovoltaic tracker array section of claim 1, wherein the bracket includes a guide ridge between the first ledge and second ledge preventing contacting between the first photovoltaic module and the second photovoltaic module.

4. A photovoltaic tracker array section, comprising:
a torque tube;
a bracket mounted to the torque tube;
a first photovoltaic module contacting a first ledge of the bracket;
a second photovoltaic module contacting a second ledge of the bracket, opposite the first ledge;
a clamp including a handle, a first hook rotatably attached to the handle, and a second hook rotatably attached to the handle;
wherein the clamp is configured to simultaneously secure the first photovoltaic module to the first ledge of the bracket with the first hook, and secure the second photovoltaic module to the second ledge of the bracket with the second hook,
wherein the clamp is rotatable from a first position wherein the first hook contacts the first photovoltaic module, the second hook contacts the second photovoltaic module, and no clamping forces are exerted by the first hook on the first photovoltaic module or by the second hook on the second photovoltaic module, to a second position wherein a first clamping force is exerted by the first hook on the first photovoltaic module and a second clamping force is exerted by the second hook on the second photovoltaic module.

5. The photovoltaic tracker array section of claim 4, wherein the first hook and second hook cross in the second position.

6. The photovoltaic tracker array section of claim 1:
wherein the handle includes a generally U-shaped cross section defining a channel; and
wherein the second hook includes a portion within the channel.

7. A photovoltaic tracker array section, comprising:
a torque tube;
a bracket mounted to the torque tube;
a first photovoltaic module contacting a first ledge of the bracket;
a second photovoltaic module contacting a second ledge of the bracket, opposite the first ledge;
a clamp including a handle, a first hook rotatably attached to the handle, and a second hook rotatably attached to the handle;
wherein the clamp is configured to simultaneously secure the first photovoltaic module to the first ledge of the bracket with the first hook, and secure the second photovoltaic module to the second ledge of the bracket with the second hook;
wherein the handle includes a first sidewall between a top side and a bottom side of the handle, and a second sidewall, opposite the first sidewall, between the top side and bottom side;
wherein the first hook includes a first leg extending from an outside surface of the first sidewall, a second leg extending from an outside surface of the second sidewall, and a first end portion connecting the first leg and second leg; and
wherein the second hook includes a third leg extending from an inside surface of the first sidewall, a fourth leg extending from an inside surface of the second sidewall, and a second end portion connecting the third leg and fourth leg.

8. The photovoltaic tracker array section of claim 1:
wherein the first photovoltaic module includes a first frame including a first channel;
wherein the second photovoltaic module includes a second frame including a second channel; and
wherein the first hook is positioned within the first channel, and the second hook is positioned within the second channel.

* * * * *